United States Patent [19]

Smith

[11] Patent Number: 5,142,198
[45] Date of Patent: Aug. 25, 1992

[54] MICROWAVE REACTIVE GAS DISCHARGE DEVICE

[75] Inventor: Donald K. Smith, Arlington, Mass.

[73] Assignee: Applied Science and Technology, Inc., Woburn, Mass.

[21] Appl. No.: 454,522

[22] Filed: Dec. 21, 1989

[51] Int. Cl.⁵ .............................................. H05H 1/24
[52] U.S. Cl. ........................... 315/111.21; 315/111.31; 315/111.71; 313/231.31
[58] Field of Search ....................... 315/111.01, 111.21, 315/111.31, 111.41, 111.71, 111.81, 111.91; 313/231.31, 231.61

[56] References Cited

U.S. PATENT DOCUMENTS

| | | | |
|---|---|---|---|
| Re. 32,626 | 3/1988 | Yoshizawa et al. | 315/111.21 X |
| 4,507,588 | 3/1985 | Asmussen et al. | 315/111.41 X |
| 4,673,846 | 6/1987 | Yoshizawa et al. | 315/111.21 X |
| 4,727,293 | 2/1988 | Asmussen et al. | 315/111.81 X |
| 4,857,809 | 8/1989 | Torii et al. | 315/111.41 X |
| 4,866,346 | 9/1989 | Gaudreau et al. | 315/111.21 |
| 4,911,814 | 3/1990 | Matsuoka et al. | 315/111.41 X |
| 4,937,456 | 6/1990 | Grim et al. | 315/111.41 X |
| 4,992,665 | 2/1991 | Möhl | 315/111.81 X |
| 5,010,276 | 4/1991 | Echizen et al. | 315/111.21 |

FOREIGN PATENT DOCUMENTS 3810197  10/1988  Fed. Rep. of Germany .

Primary Examiner—Eugene R. LaRoche
Assistant Examiner—Do Hyum You
Attorney, Agent, or Firm—Iandiorio & Dingman

[57] ABSTRACT

A reactive discharge device including an RF cavity with a substantially circular cross-section, with a circular RF field coupled along the longitudinal axis of the cavity. A high volume to surface area ratio volume of reactive gas is created in the cavity. The reactive gas and/or the light created thereby is extracted from the cavity and supplied to a downstream processing area.

16 Claims, 3 Drawing Sheets

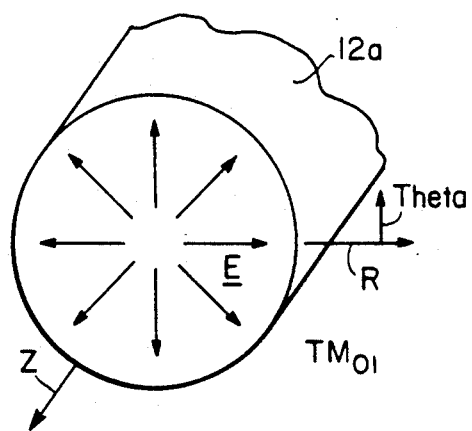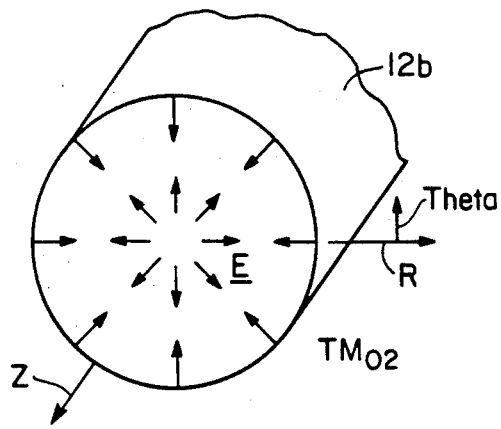
Fig. 2A    Fig. 2B
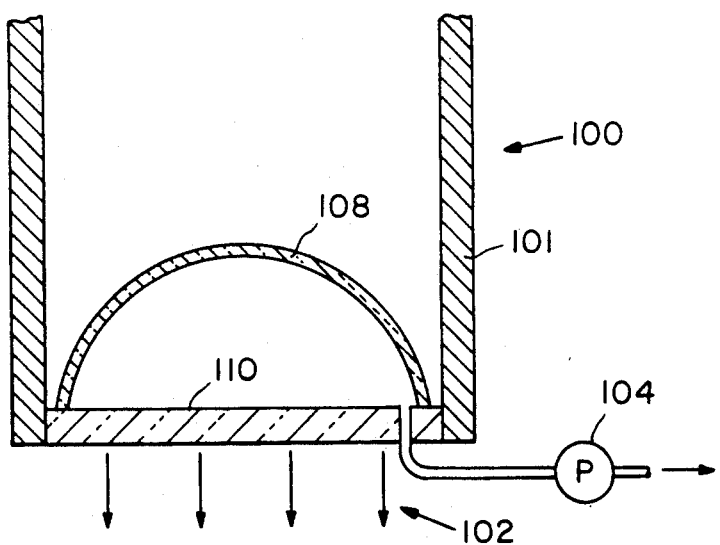
Fig. 4

MICROWAVE REACTIVE GAS DISCHARGE DEVICE

FIELD OF INVENTION

This invention relates to a microwave reactive gas discharge device and more particularly to a microwave plasma source for efficiently producing plasma in a microwave plasma generator.

BACKGROUND OF INVENTION

Reactive gases and gas mixtures are used in many industrial operations, especially the processing of semiconductor wafers in the fabrication of integrated circuits. The gases may be used, for example, in etching the wafers and processing the photoresist. Because of the extremely fine tolerances necessary, the impinging gas stream must be as uniform as possible to uniformly process the wafer. In addition, the process should take place in the shortest possible time to maximize production rates.

There are at present two basic methods of producing the reactive gases. Both methods employ an RF field, preferably in the microwave range, to couple energy to a raw gas to produce the excited gas primarily in the form of ions and free radicals. One method generates the excited gas by passing the gas through a dielectric tube extending transversely through a microwave guide. The excited gas flows out of the waveguide to a reaction chamber in which the wafer is placed. An example of this method is disclosed in U.S. Pat. No. 4,207,452.

The other method employs a flat cylindrical plasma-production chamber mounted in a waveguide. The raw gas is introduced into the chamber to form a thin disc of the excited gas. The wafer to be processed may then be mounted in the chamber, or the excited gas may be drawn from the chamber into a downstream reaction chamber. An example of this method is disclosed in U.S. Pat. No. 4,507,588.

Both of the methods have drawbacks which limit their utility for wafer processing. The method of U.S. Pat. No. 4,207,452 is a good source of radicals but a poor source of ions due to the recombination of ions on the inside surface of the dielectric tube. The low gas volume to tube surface area ratio coupled with the tube length creates a high probability that the ions produced in the waveguide will contact a wall before they impinge on the wafer being processed. As the ions collect on the walls, they tend to recombine into molecules, destroying their utility as excited gas species. Thus, the patented method is only practically useful as a low volume, small area radical source.

The method of U.S. Pat. No. 4,507,588 also exhibits a wall recombination problem due to the low gas volume to surface area ratio. Primarily, however, the method is inefficient; a large amount of raw gas and microwave power is needed to create a sufficient volume of excited gas. This inefficiency is primarily due to the size and shape of the plasma; the disc provides a very short gas residence time in which most of the gas flows out of the disc before it becomes excited.

The volume of the plasma should ideally be as large as practicable to efficiently create the reactive gas, which may include atoms, free radicals, excited species, ions and/or electrons. The reactive gas may also be used as a light source. The large volume is needed because the gas molecules must, on average, move within the plasma production area a distance known as the mean free path before the gas molecules become sufficiently excited by the electron cloud. If the size and shape of the plasma does not provide a sufficient free path distance, a low number of molecules will achieve the desired excitation state, and the resultant reactive gas will be relatively weak, causing the wafer processing to take place very slowly. In addition, the microwave power and raw gas are inefficiently used; the plasma production volume per unit of gas and power is low.

Plasmas having a large surface area relative to their volume and/or available free path distance are also relatively inefficient due to wall effects. Ions and free radicals tend to adhere to container walls, increasing their residence time and so the likelihood of their recombining, which destroys the plasma. It has been estimated that there is a seventy-five (75) to one hundred (100) percent chance of recombination when the plasma ions encounter a surface. Thus, to maximize reactive gas creation efficiency, it is desirable to create a large volume of plasma with a relatively small surface area.

SUMMARY OF INVENTION

It is therefore an object of this invention to provide a reactive gas source which is extremely efficient.

It is a further object of this invention to provide a reactive gas source which creates a large volume of plasma.

It is a further object of this invention to provide a reactive gas source which has a high ratio of volume to surface area.

It is a further object of this invention to provide a reactive gas source in which the wall effects are minimized.

It is a further object of this invention to provide a large-area uniform light source.

It is a further object of this invention to provide a very short wavelength ultraviolet source.

This invention results from the realization that the efficiency of plasma sources can be greatly improved by providing an apparatus which creates a plasma with an extremely high volume to surface area ratio.

This invention features a reactive gas discharge device for an RF reactive gas generator including an RF cavity with a substantially circular cross-section, and means for coupling a circular RF field along the longitudinal axis of the cavity. Further included are means for creating in the cavity a high volume to surface area ratio volume of reactive gas, and means for extracting the gas from the cavity for supplying it to a downstream processing area. Preferably, the means for creating the gas includes a vacuum chamber within the cavity. That vacuum chamber may include a dielectric material and may be dome-shaped. In a preferred embodiment, the vacuum chamber is approximately the same width as the cavity and has a height between approximately one-half and two times its width. The vacuum chamber may have a height which is approximately the same as its width. Preferably, the cavity is resonant.

The means for extracting the gas may include an outlet opening in the vacuum chamber. That opening may have approximately the same width as the vacuum chamber. The device may further include means proximate the outlet opening for containing the RF field in the cavity. That means may include a mesh covering the outlet opening for reflecting the microwave field and allowing the gas to pass. Preferably, the mesh is coated with a dielectric material to inhibit reactive gas destruction.

The device preferably includes means for coupling the vacuum chamber to the downstream processing area. That means for coupling may include a dielectric sleeve disposed between the outlet opening and the processing area to inhibit gas destruction. The device may also include means for introducing gas into the vacuum chamber. The means for extracting the gas may further include means for drawing it into the processing area, which is preferably accomplished with a vacuum pump.

A reactive gas light source may be accomplished by providing the light emitted from the reactive gas volume to a downstream processing area, which is preferably accomplished with a dielectric window across the RF cavity or a tube bundle aligned with the cavity to inhibit gas flow and allow hard ultraviolet to pass through. In either case, a large-area ultraviolet source is created, preferably an axisymmetric source from an axisymmetric microwave field, for uniform downstream use.

DISCLOSURE OF PREFERRED EMBODIMENT

Other objects, features and advantages will occur to those skilled in the art from the following description of a preferred embodiment and the accompanying drawings, in which:

FIGS. 2A and 2B are schematic diagrams of transverse magnetic mode microwave fields with no angular dependence for use in the device of FIG. 1A;

FIG. 4 is a schematic, cross sectional view of another alternative reactive gas discharge device according to this invention.

This invention may be accomplished with a reactive gas source for an RF generator including an RF cavity having a substantially circular cross-section and means for coupling a circular RF field along the longitudinal axis of the cavity. Further included are means for creating in the cavity a high volume to surface area ratio reactive gas volume, and means for extracting the reactive gas from the cavity for supplying it to a downstream processing area. The reactive gas is preferably generally spherical for providing the greatest possible volume and average free-path distance with the minimum possible surface area to most efficiently produce the reactive gas.

Figure 1A:
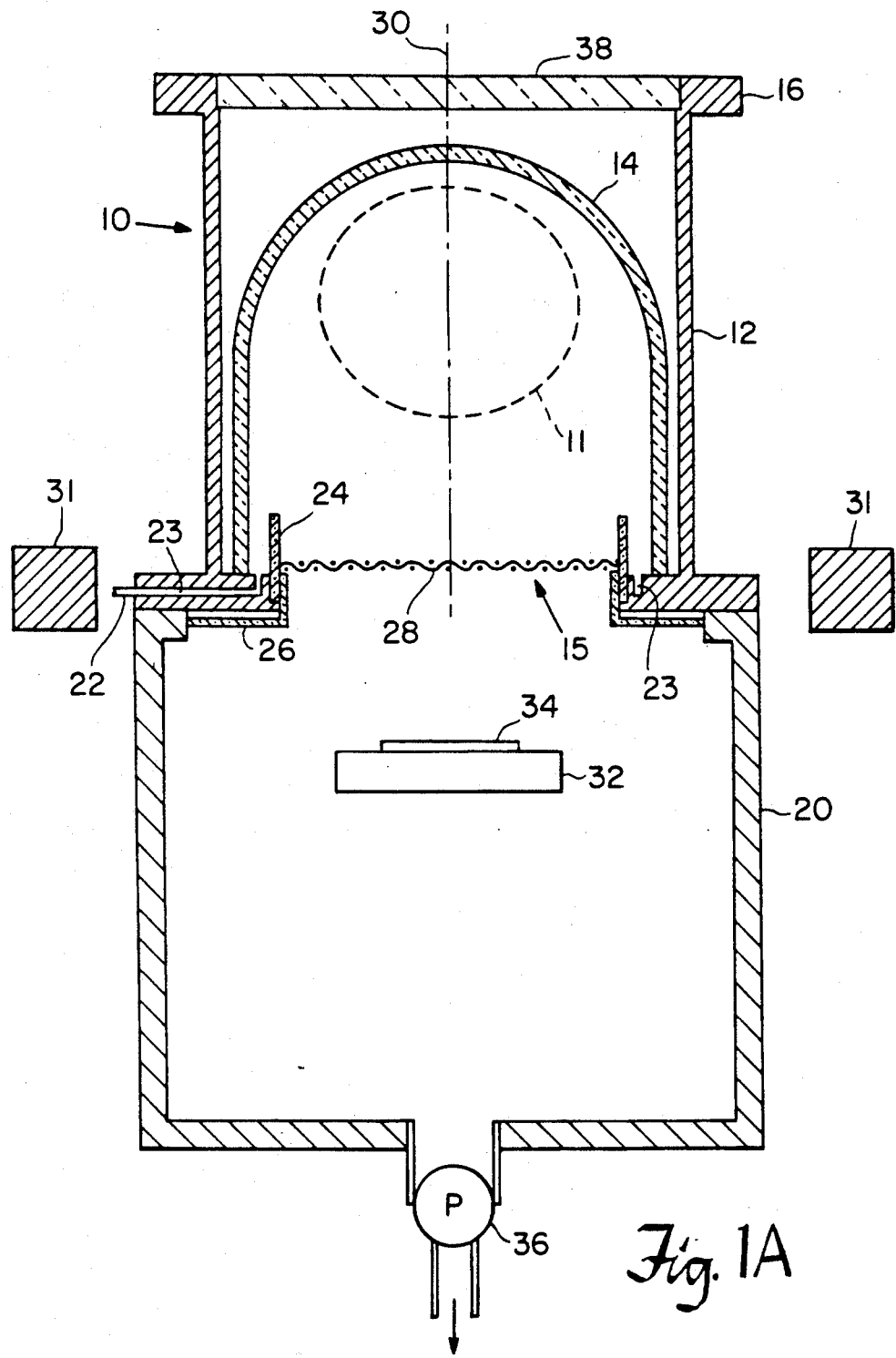
FIG. 1A is a schematic, cross-sectional view of a microwave reactive gas discharge device according to this invention.

There is shown in FIG. 1A microwave reactive gas discharge device 10 according to this invention for producing large reactive gas volume 11, shown in dashed line. Volume 11 preferably has a generally spherical shape, and may fill a large portion of bell-jar 14. Discharge device 10 includes cylindrical RF cavity 12 with flange 16 for attachment to a cylindrical microwave guide, not shown. A circular RF field is coupled into cavity 12 along longitudinal axis 30 through window 38. Preferably, the RF field is axisymmetric for creating an axisymmetric reactive gas as is more fully described below.

Disposed within cavity 12 is dielectric bell-jar vacuum chamber 14 with opening 15 which leads to processing chamber 20. Chamber 14 is preferably made of quartz or alumina. Gas feed stock is introduced into vacuum chamber 14 through tube 22 which leads to circumferential cavity 23. Dielectric annular shield 24 directs the gas up toward the top of bell-jar 14 and relatively uniformly around the circumference thereof.

As the gas enters bell-jar 14, it is exposed to the microwave field. Preferably, the field is an axisymmetric transverse magnetic mode with no angular dependence and an integral number of radial mode nodes for creating an axisymmetric volume of reactive gas. Bell-jar 14 has a height from approximately one-half to two times its width for providing a large reactive gas-production volume which together with the circumferential gas flow and axisymmetric microwave mode creates the generally spherical shape, thereby providing the largest possible volume per surface area to maximize the reactive gas production efficiency and average free-path distance, and minimize the reactive gas volume surface area. As a result, the reactive gas flow rate per unit of input power and gas is increased by up to a factor of 10 over the other devices and the time needed to process substrate 34 on substrate holder 32 is concurrently decreased. Annular magnet 31 can be included to create a magnetic field to guide the reactive gas toward substrate 34. Magnet 31 may be an electromagnetic coil or permanent magnet, and would create essentially a stream of excited species impinging on substrate 34. It should be understood that more than one magnet may be used, or none at all, depending on the amount of reactive gas guidance needed.

Initially, some free electrons will exist in the gas, or they may be created by a spark or ultraviolet light used to initiate the plasma discharge. These electrons are accelerated by the microwave electric field so that their energy is sufficient to ionize atoms of the gas with which they collide. The electrons from these ionizations are then also accelerated and so on until a dense plasma is obtained. The power flow in such a plasma is from the microwave field to the free electrons to the ions, atoms and molecules with which the electrons collide. The excited ions, atoms and molecules then carry the energy out of the plasma to the surfaces they strike, or they may radiate as photons the energy they received from the electrons.

The generally spherical shape of the plasma provides a substantial thickness of plasma for a gas atom to traverse before it can escape, thereby optimizing the probability of ionizing the gas atoms. Additionally, the generally spherical shape provides maximum density ad temperature of electrons in its core for a given amount of input power, as the sphere has the lowest possible energy-depleting surface area in relation to the retained plasma volume. If the plasma were thin in any dimension, then the energy carrying electrons and excited atoms would diffuse rapidly to the walls of the chamber, carrying with them plasma energy. This diffusion loss of energy is analogous to normal heat flow where the spherical shape is also optimum for heat retention. Thus, the high volume/surface area ratio, preferably spherical, plasma or reactive gas volume is the most efficient source of reactive gas.

Opening 15 may be closed with mesh 28, which may be a wire mesh. Mesh 28 serves to close to microwaves cavity 12 to provide a microwave cavity, which may be resonant. Without the mesh, reactive gas volume 11 reflects most of the power to keep it in cavity 12; very little leaks into chamber 20. Thus, the microwave cavity may in effect be provided without mesh 28. Annular dielectric sleeve 26 may be placed between gas directing sleeve 24 and processing chamber 20 to cover the exposed metallic surfaces of chamber 20 and/or cavity 12 for minimizing the wall effects to keep the reactive gas from being destroyed before it impinges on substrate 34; wall effects are substantially lower on dielectric as compared to metallic surfaces. Vacuum pump 36 is disposed at the end of chamber 20 for exhausting the excited gas out of chamber 20. With an axisymmetric microwave field coupled along axis 30, the reactive gas is produced axisymmetrically to provide uniform processing of wafer 34.

Figure 1B:
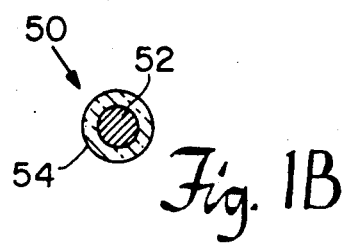
FIG. 1B is an enlarged, cross-sectional view of the screen for the reactive gas chamber opening of the device of FIG. 1A.

With device 10, FIG. 1A, the reactive gas encounters no metal walls before it reaches substrate 34. Coupled with the high volume/surface area ratio, the result is the absolute minimization of wall recombination and consequent maximizing of the volume of reactive gas generated. Together with the long mean free path, the result is an extremely efficient, high flow rate reactive gas source for fast, uniform processing of downstream components. If used, wire mesh 28 provides a small metal surface in the gas flow path, which leads to a slightly greater amount of ion recombination than would a dielectric surface. Thus, it is preferable to employ mesh 50, FIG. 1B, which includes metal wire core 52 for strength, covered with dielectric 54 which may be, for example, a quartz material. By using mesh 50, the plasma encounters no metal surfaces at all and the recombination is held to an absolute minimum.

As described above, a circular axisymmetric microwave field is preferably coupled to the vacuum chamber. Two examples of those fields are disclosed in FIGS. 2A and 2B. A transverse magnetic mode with no angular dependence and one radial mode node is shown in FIG. 2A. A similar field with two radial mode nodes is shown in FIG. 2B. These are but two examples of axisymmetric microwave fields which may be coupled to cavity 12 for efficiently creating an axisymmetric reactive gas volume for fast, uniform processing of a semiconductor wafer or any other application requiring a plasma source.

Figure 3A:
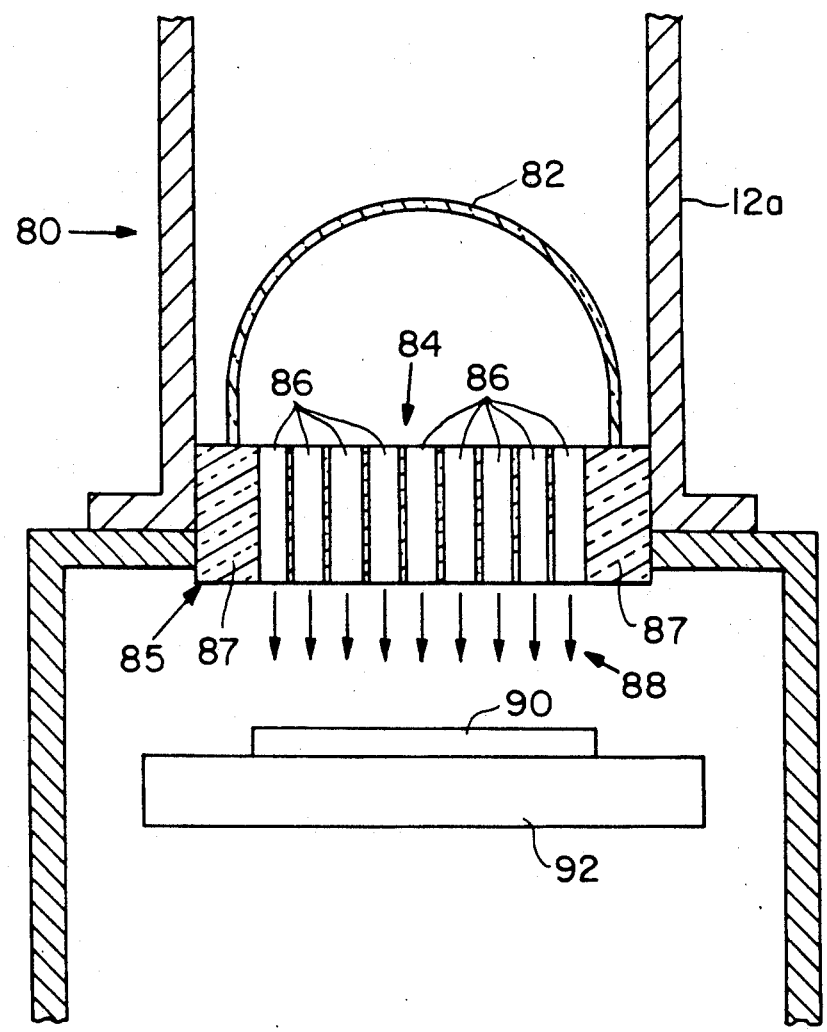
FIGS. 3A and 3B are schematic cross-sectional and top plan views of an alternative microwave reactive gas discharge device according to this invention.
Figure 3B:
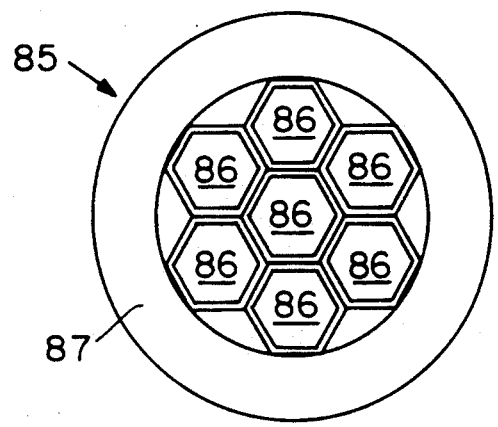

Generator 80, FIG. 3A, may be used as a hard (short wavelength) ultraviolet source and/or reactive gas source. Instead of being left open or enclosed with a mesh, opening 84 of bell-jar 82 is closed with tube array 85, shown in a top view in FIG. 3B. Array 85 includes a number of hexagonal tubes 86 open at both ends and bundled in a honeycomb shape to provide a volume-filling array. The size and shape of the tubes may vary. Outer solid area 87 provides a seat for bell-jar 82.

When reactive gas is formed in bell-jar 82 it emits hard ultraviolet radiation, which can be used in downstream photochemical processing, for example to strip photoresist from chip 90 supported by substrate 92. The ultraviolet may alternatively be used for patterned etching using a gas excited by the ultraviolet, or as an ultraviolet research tool. In any case, the tube bundle provides the open light paths necessary to convey the ultraviolet, which will not pass through a solid wall or window; the ultraviolet is thus supplied to chip 90 as beam 88 about as wide as the bundle for uniform, large-area ultraviolet processing. The length, number and small diameter of tubes 86 inhibit gas flow by creating a pressure drop due to the wall drag, and also provide a large wall surface area for gas recombination, which together allow device 80 to be used as a ultraviolet source with a low gas flow rate and with little contamination of chamber 94 with reactive gas.

In another embodiment, FIG. 4, reactive gas generator 100 may be used as a soft (longer wavelength) ultraviolet light source by closing the end of cavity 101 with dielectric window 110 to provide large area circular light beam 102. Pump 104 may be provided to maintain gas flow through bell-jar 108, although in this embodiment the reactive gas chamber may be sealed, since the reactive gas itself is not being used. In any case, the high volume, axisymmetric reactive gas volume of the light generator of this invention provides a large-area essentially circular, axisymmetric light beam for downstream use without the need for ultraviolet lamps. The result is extremely uniform, fast ultraviolet processing.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A reactive gas discharge device for an RF reactive gas generator, comprising:
    an RF cavity having a substantially circular cross-section;
    means for coupling a circular RF field along the longitudinal axis of said RF cavity;
    a dielectric, bell-jar enclosed, vacuum chamber within said cavity having substantially the same height and width for creating in said cavity a generally spherical volume of reactive gas;
    said spherical volume defining a large volume of plasma with a relatively small surface area, to maximize reactive gas creation efficiency; and
    means for extracting said reactive gas from said vacuum chamber to a downstream processing area.

2. The device of claim 1 in which said vacuum chamber is dome shaped.

3. The device of claim 1 in which said vacuum chamber is approximately the same width as said cavity.

4. The device of claim 1 in which said means for extracting includes an outlet opening in said vacuum chamber.

5. The device of claim 4 further including means for coupling said vacuum chamber to the downstream processing area.

6. The device of claim 5 in which said means for coupling said vacuum chamber includes a dielectric sleeve disposed between said outlet opening and said processing area to inhibit reactive gas destruction.

7. The device of claim 4 in which said outlet opening has approximately the same width as said vacuum chamber.

8. The device of claim 4 further including means, proximate said outlet opening, for containing the RF field in said cavity.

9. The device of claim 8 in which said means for containing includes a mesh covering said outlet opening for reflecting the circular RF field and allowing said reactive gas to pass.

10. The device of claim 9 in which the exposed surface of said mesh is covered with a dielectric material to inhibit reactive gas destruction.

11. The device of claim 1 in which said vacuum chamber includes means for introducing gas into said vacuum chamber.

12. The device of claim 1 in which said cavity is resonant for efficiently coupling microwave power to said reactive gas.

13. The device of claim 1 in which said means for extracting includes means for drawing said reactive gas into the processing area.

14. The device of claim 13 in which said means for drawing includes a vacuum pump.

15. A reactive gas source for a microwave reactive gas generator, comprising:
   a generally cylindrical microwave cavity;
   means for coupling a circular microwave field along the longitudinal axis of said cavity;
   a dielectric bell-jar vacuum chamber mounted in said cavity having approximately the same width and height for substantially filling said cavity;
   means for introducing a gas into said vacuum chamber for creating a generally spherical reactive gas volume in said vacuum chamber;
   a reaction chamber attached to said microwave cavity;
   an outlet opening in said vacuum chamber for supplying the reactive gas to said reaction chamber;
   means for drawing the reactive gas from said vacuum chamber to said reaction chamber; and
   a dielectric coupling sleeve between said outlet opening and said reaction chamber for inhibiting the destruction of the reactive gas as it is drawn out of said vacuum chamber.

16. A reactive gas discharge device for an RF reactive gas generator, comprising:
   an RF cavity having a substantially circular cross-section;
   means for coupling a circular RF field along the longitudinal axis of said RF cavity;
   a vacuum chamber within said cavity and having an outlet opening; and
   means for coupling said vacuum chamber to a downstream processing area, said means for coupling said vacuum chamber including a dielectric sleeve disposed between said outlet opening and the processing area to inhibit reactive gas destruction.

* * * * *